(12) United States Patent
Gao et al.

(10) Patent No.: US 11,910,695 B2
(45) Date of Patent: Feb. 20, 2024

(54) MASK PLATE, DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Wenhui Gao, Beijing (CN); Kai Zhang, Beijing (CN); Erlong Song, Beijing (CN); Lingran Wang, Beijing (CN); Jianjie Liu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 232 days.

(21) Appl. No.: 17/406,712

(22) Filed: Aug. 19, 2021

(65) Prior Publication Data

US 2022/0131077 A1     Apr. 28, 2022

(30) Foreign Application Priority Data

Oct. 28, 2020   (CN) .......................... 202011174883.X

(51) Int. Cl.
| | | |
|---|---|---|
| *H01L 51/00* | (2006.01) | |
| *G03F 1/32* | (2012.01) | |
| *H01L 27/32* | (2006.01) | |
| *H01L 51/56* | (2006.01) | |
| *H10K 71/20* | (2023.01) | |
| *H10K 59/123* | (2023.01) | |
| *H10K 71/00* | (2023.01) | |
| *H10K 59/124* | (2023.01) | |
| *H10K 59/12* | (2023.01) | |

(52) U.S. Cl.
CPC ............. *H10K 71/233* (2023.02); *G03F 1/32* (2013.01); *H10K 59/1201* (2023.02); *H10K 59/123* (2023.02); *H10K 59/124* (2023.02); *H10K 71/00* (2023.02)

(58) Field of Classification Search
CPC ........................... H10K 59/123; H10K 59/124
See application file for complete search history.

(56) References Cited

U.S. PATENT DOCUMENTS

| | | | | |
|---|---|---|---|---|
| 2014/0132872 | A1* | 5/2014 | Kimura | G02F 1/1333 |
| | | | | 349/43 |
| 2018/0033836 | A1* | 2/2018 | Lee | H10K 50/822 |
| 2018/0159076 | A1* | 6/2018 | Yun | H10K 50/813 |
| 2023/0309344 | A1* | 9/2023 | Lee | H10K 59/124 |

* cited by examiner

*Primary Examiner* — Victoria K. Hall
(74) *Attorney, Agent, or Firm* — Myers Bigel, P.A.

(57) ABSTRACT

The present disclosure provides a mask plate, a display panel and a display device. The mask plate comprises: a transparent substrate; an opaque film layer, the opaque film layer being disposed on the transparent substrate. The opaque film layer includes a plurality of first regions and a plurality of second regions, a first sub-region in the first region and the second region are transmissive, and the remaining portion in the first region is semi-transmissive. The mask plate is used to form via holes in the planarization layer of the display panel by exposure, so that the angles between the metal electrode layers disposed in the via holes and the source/drain layers of the display panel are small and diversified, decreasing the visibility of the metal electrode layers.

8 Claims, 4 Drawing Sheets

MASK PLATE, DISPLAY PANEL AND DISPLAY DEVICE

RELATED APPLICATION

The present application claims the benefit of Chinese Patent Application No. 202011174883.X filed on Oct. 28, 2020, the entire disclosure of which is incorporated herein by reference.

TECHNICAL FIELD

The present disclosure generally relates to the field of display technology, specifically to a mask plate, a display panel and a display device.

BACKGROUND

In the field of display technology, organic light emitting displays (OLEDs) have advantages such as self-luminescence, abundant colors, wide viewing angle, low power consumption, and so on, which meet the requirements of modern people for display technology and have become one of the primary research directions in the field of display technology.

In the related art, a commonly used display panel at least comprises a substrate, a driving function film layer, a display function film layer and a thin film encapsulation layer that are stacked successively. A planarization layer is arranged between the driving function film layer and the display function film layer. The source/drain layers arranged at intervals in the driving function film layer are in one-to-one correspondence and contact with the metal electrode layers that constitute a plurality of sub-pixels of the display function film layer, so as to ensure realization of the display function of the display panel.

During the manufacturing process of a display panel, a plurality of via holes are formed in the planarization layer through a mask process to expose the source/drain layers, and in each via hole a sub-pixel corresponding to the via hole is formed. The planarization layer is usually an organic film layer, and the edge of the planarization layer forming a via hole has an angle with respect to the source/drain layer. Therefore, the material of the metal electrode layer forming a sub-pixel has high reflectivity. In the case where the display panel is in an unlit state and the ambient light is light with high luminance, the portion of the metal electrode layer that has an angle with the source/drain layer will reflect the ambient light. The metal electrode layer has high visibility, and the display panel observed by human eyes appears grey.

SUMMARY

In a first aspect, the present disclosure provides a mask plate comprising: a transparent substrate; and an opaque film layer, the opaque film layer being disposed on the transparent substrate, the opaque film layer comprising a plurality of first regions and a plurality of second regions, a first sub-region in a first region and the second region being transmissive, a remaining portion in the first region being semi-transmissive.

In a second aspect, the present disclosure provides a display panel comprising: a substrate; a driving function film layer, the driving function film layer being disposed on the substrate; a planarization layer, the planarization layer being disposed on a side of the driving function film layer away from the substrate and provided with a plurality of via holes, the plurality of via holes exposing a plurality of source/drain layers arranged at intervals in the driving function film layer and formed by etching based on the mask plate described above; and a display function film layer, the display function film layer being disposed on a side of the planarization layer away from the substrate, and a partial region of the first metal electrode layer of each sub-pixel in the display function film layer being disposed in a corresponding via hole to connect the first metal electrode layer to the source/drain layer.

In a third aspect, the present disclosure provides a display device comprising the display panel according to the second aspect. Alternatively, in the display panel of the display device, the plurality of via holes exposing the source/drain layers are formed by etching based on the mask plate according to the first aspect.

BRIEF DESCRIPTION OF THE DRAWINGS

In order to more clearly illustrate the technical solutions in embodiments of the present disclosure or in the prior art, the accompanying drawings needed to be used in the description of the embodiments or the prior art will be introduced briefly below.

Obviously, the drawings in the following description are only some embodiments of the present disclosure, and for those of ordinary skill in the art, other drawings may be obtained according to these drawings without undue experimentation.

DETAILED DESCRIPTION

The technical solutions in embodiments of the present disclosure will be clearly and completely described below in conjunction with the accompanying drawings in the embodiments of the present disclosure. Obviously, the described embodiments are only part of the embodiments of the present disclosure, rather than all of the embodiments. Based on the embodiments in the present disclosure, all other embodiments obtained by those of ordinary skill in the art without undue experimentation pertain to the protection scope of the present disclosure.

Figure 1:
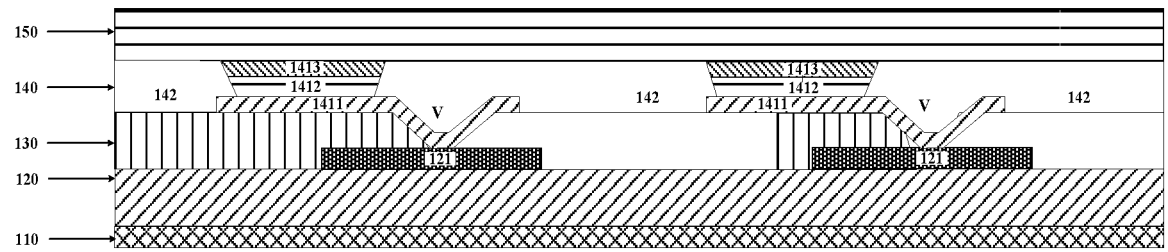
FIG. 1 is a schematic structural view of a display panel provided by the related art.

FIG. 1 is a schematic structural view of a display region (region AA) in a display panel provided by the related art. As shown in FIG. 1, the display panel comprises a substrate 110, a driving function film layer 120 disposed on the substrate 110, a planarization layer 130 disposed on a side of the driving function film layer 120 away from the substrate, and a display function film layer 140 disposed a side of the planarization layer 130 away from the substrate, which are stacked successively. The display function film layer 140 may comprise a plurality of sub-pixels and a pixel definition layer 142 disposed in the same layer as the plurality of sub-pixels. Optionally, as shown in FIG. 1, the display panel further comprises a thin film encapsulation layer 150 disposed on a side of the sub-pixels away from the substrate 110.

The planarization layer 130 is provided with a plurality of via holes V, and the plurality of via holes V expose source/drain layers (SD layers) 121 arranged at intervals in the driving function film layer 120. A partial region of a first metal electrode layer 1411 constituting a sub-pixel in the display function film layer 140 is disposed in the via hole V. The pixel definition layer 142 includes a plurality of via holes, and the plurality of via holes expose the first metal electrode layer 1411. An organic light emitting layer 1412 and a second metal electrode layer 1413 are disposed successively in the via hole in the pixel definition layer to form a sub-pixel. The first metal electrode layer 1411 may be an anode layer, the second metal electrode layer 1413 may be a cathode layer, and the projection of the via hole in the pixel definition layer on the substrate and the projection of the via hole V in the planarization layer on the substrate do not overlap.

During the process of manufacturing the display panel shown in FIG. 1, the via hole V in the planarization layer is made by a mask process. The edge of the planarization layer forming a via hole has a large angle with respect to the source/drain layer exposed in the via hole, and the edge of each via hole has substantially the same angle, resulting a large angle between the first metal electrode layer 1411 and the source/drain layer 121 in the via hole. The mask process refers to a photolithography process (also called a patterning process) performed using a mask plate. The mask process usually includes photoresist coating, exposure, development, etching, and photoresist stripping processes, which is a commonly used film etching process in the manufacturing process of a display panel.

Figure 2:
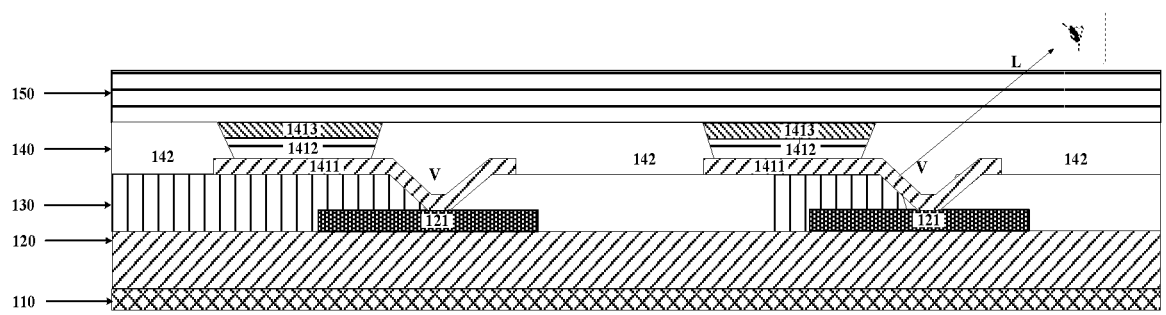
FIG. 2 is a light path diagram when a display panel provided by the related art reflects ambient light.

In the related art, the material for fabricating the first metal electrode layer during the manufacturing process of a display panel is usually a metal material with large reflectivity. As shown in FIG. 2, in the case where the display panel is in an unlit state and the ambient light is light with high luminance, the portion of the first metal electrode layer 1411 in the plurality of via holes V of the planarization layer 130 that has a large angle with respect to the source/drain layer 121 will reflect ambient light L towards a specific direction. When the reflected light enters human eyes, the display panel observed by human eyes appears grey, and the metal electrode layer has high visibility, resulting in deficiencies.

Figure 3:
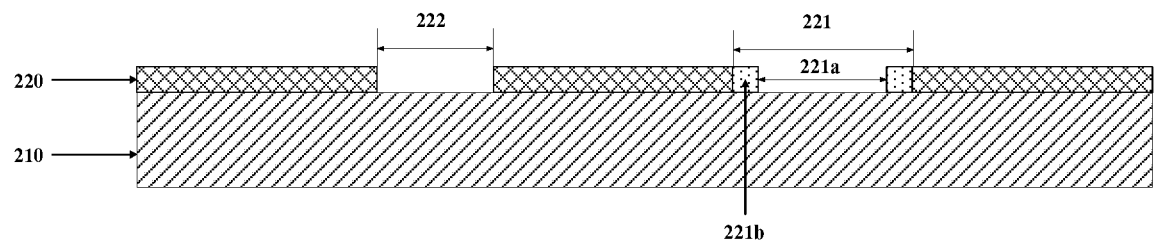
FIG. 3 is a schematic structural view of a partial section of a mask plate provided by an embodiment of the present disclosure.

An embodiment of the present disclosure provides a mask plate. During the manufacturing process of a display panel, the mask plate 200 may be used to etch the planarization layer between the driving function film layer and the display function film layer so as to form a plurality of via holes for exposing the source/drain layers arranged at intervals in the driving function film layer, so that the source/drain layers are connected to the first metal layer for forming each sub-pixel in the display function film layer through the plurality of via holes. As shown in FIG. 3, FIG. 3 is a schematic view illustrating a partial section of the mask plate, the mask plate comprising a transparent substrate 210 and an opaque film layer 220.

The transparent substrate 210 is capable of completely transmitting irradiation light during the exposure process. The material of the transparent substrate may be quartz.

Figure 4:
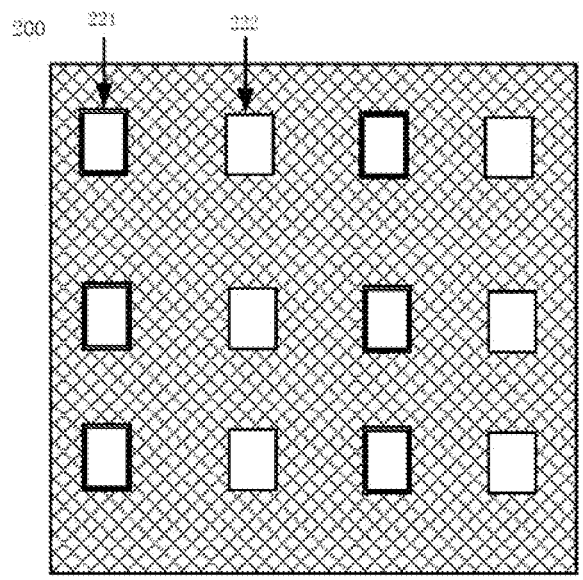
FIG. 4 is a schematic top view of a mask plate provided by an embodiment of the present disclosure.

The opaque film 220 is capable of completely blocking irradiation light during the exposure process. The opaque film layer is arranged on the transparent substrate. An opaque material forming the opaque film layer may be chromium (Cr). FIG. 4 is a partial top view of the mask plate. The opaque film layer 220 includes a plurality of first regions 221 and a plurality of second regions 222. During the manufacturing process of a display panel, the first region corresponds to a first via hole formed by exposure, and the second region corresponds to a second via hole formed by exposure. The first via hole and the second via hole are arranged in the planarization layer between the driving function film layer and the display function film layer of the display panel.

Continuing to refer to FIGS. 3 and 4, a first sub-region 221a in the first region 221 and the second region 222 are transmissive and capable of completely transmitting irradiation light during the exposure process. The remaining portion in the first region is semi-transmissive, which can ensure that the angle between the edge of the planarization layer forming the first via hole by exposure and the source/drain layer is smaller than the edge of the planarization layer forming the second via hole by exposure and the source/drain layer. In the case where the manufactured display panel is in an unlit state and the ambient light is light with high luminance, the metal electrode layers in the via holes have a variety of angles with respect to the source/drain layers. As a result, the ambient light can be reflected from more than one direction, which reduces the possibility of reflected light entering human eyes, decreases the visibility of the metal electrode layer, and improves the deficiencies of the display panel in the dark state.

It can be understood that, in the embodiment of the present disclosure, the patterns of the first region and the second region may be determined based on actual needs, which is not limited in the embodiment of the present disclosure. Optionally, the patterns of the first region and the second region may be rectangular shapes as shown in FIG. 4, and the ratio of the width to the length may be 3:4.

In the embodiment of the present disclosure, the structure of the first region may include the following two optional implementation manners.

Figure 5:
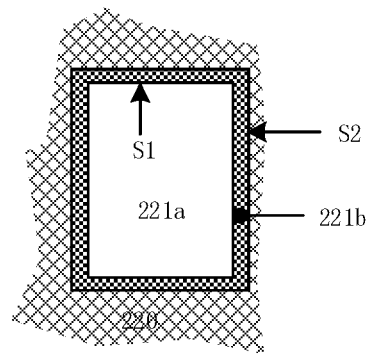
FIG. 5 is a schematic structural view of a first region in a mask plate provided by an embodiment of the present disclosure.

In an optional implementation manner, FIG. 5 shows a schematic structural view of a first region provided by an embodiment of the present disclosure. The first region 221 includes a first sub-region 221a and the remaining portion. The remaining portion is a second sub-region 221b surrounding the first sub-region 221a. The second sub-region 221b is semi-transmissive and is provided with a semi-transmissive film layer. Referring to the schematic view of a partial section of the mask plate as shown in FIG. 3, the second sub-region 221b of the first region 221 is provided with a semi-transmissive film layer. The material of the semi-transmissive film layer may be chromium oxide or silicon nitride.

In the context of the present disclosure, "transmissive" means that the light transmittance for the irradiation light during the exposure process is greater than 90%, optionally greater than 95%; "semi-transmissive" means that the light transmittance for the irradiation light during the exposure process is 10%-90%; "opaque" means that the light transmittance for the irradiation light during the exposure process is less than 10%, optionally less than 5%. It can be understood that the atomic weight of the semi-transmissive material for forming the semi-transmissive film layer is not limited in the embodiment of the present disclosure, which can be determined based on actual needs. In general, it is necessary to ensure that the light transmittance of the semi-transmissive film layer formed is 10%-90% (for the irradiation light during the exposure process).

Optionally, continuing to refer to FIG. 5, the distance between a first edge line S1 and a second edge line S2 in the first region 221 is 0.5-3 μm. The first edge line S1 is a boundary line between the second sub-region 221b and the first sub-region 221a. The second edge line S2 is a boundary line between the second sub-region 221b and the opaque film layer 220.

It is to be noted that, in the embodiment of the present disclosure, for each first region 221 in the mask plate, the distance between the first edge line S1 and the second edge line S2 may be constant. For the plurality of first regions 221 in the mask plate, the above distances may be different from each other. Therefore, it can be ensured that the angle between the edge of the planarization layer forming the first via hole by exposure and the source/drain layer is smaller, and the angles between the planarization layer edges of the plurality of first via holes and the source/drain layers may be different from each other. In the case where the manufactured display panel is in an unlit state and the ambient light is light with high luminance, the metal electrode layers in the via holes have a variety of angles with respect to the source/drain layers. As a result, the ambient light can be reflected from multiple directions, which further reduces the possibility of reflected light entering human eyes, and decreases the visibility of the metal electrode layer.

Figure 6:
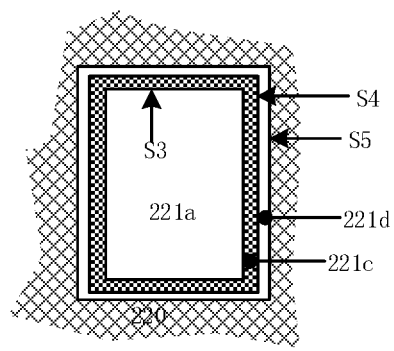
FIG. 6 is a schematic structural view of the first region in another mask plate provided by an embodiment of the present disclosure.
Figure 7:
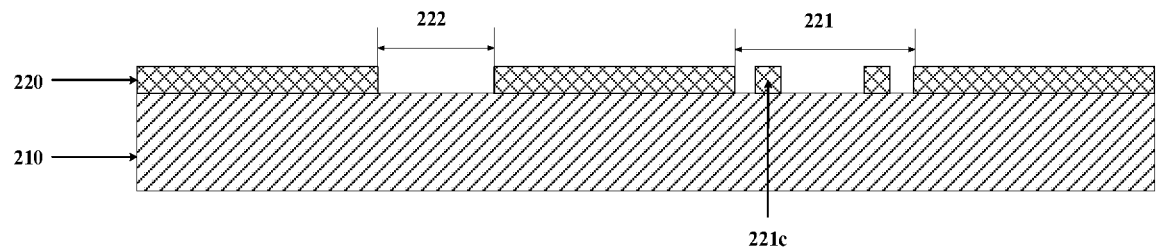
FIG. 7 is a schematic structural view of a partial section of another mask plate provided by an embodiment of the present disclosure.

In another optional implementation manner, FIG. 6 shows a schematic structural view of another first region provided by an embodiment of the present disclosure. The remaining portion in the first region 221 includes a third sub-region 221c and a fourth sub-region 221d. The third sub-region 221c surrounds the first sub-region 221a, and the fourth sub-region 221d surrounds the third sub-region 221c. The fourth sub-region 221d is transmissive. The third sub-region 221c is opaque and is provided with an opaque material. The opaque material may be the same as the opaque material forming the opaque film layer. FIG. 7 is a schematic view of a partial section of the mask plate. The third sub-region 221c of the first region 221 is provided with an opaque material.

Optionally, continuing to refer to FIG. 6, the distance between the third edge line S3 and the fourth edge line S4 in the first region 221 is 0.5-2 μm. The distance between the fourth edge line S4 and the fifth edge line S5 in the first region 221 is 0.5-2.5 μm. The third edge line S3 is a boundary line between the third sub-region 221c and the first sub-region 221a. The fourth edge line S4 is a boundary line between the third sub-region 221c and the fourth sub-region 221d. The fifth edge line S5 is a boundary line between the opaque film layer 220 and the fourth sub-region 221d.

It is to be noted that, in the embodiment of the present disclosure, the distance between the third edge and the fourth edge in each first region of the mask plate may be different, and the distance between the fourth edge and the fifth edge may also be different. It can be ensured that the angle between the edge of the planarization layer forming a via hole corresponding to a first region by exposure and the source/drain layer is smaller, and the angles between the planarization layer edges of different first via holes and the source/drain layers are different. In the case where the manufactured display panel is in an unlit state and the ambient light is light with high luminance, the metal electrode layers in the via holes have a variety of angles with respect to the source/drain layers. As a result, the ambient light can be reflected from multiple directions, which further reduces the possibility of reflected light entering human eyes, and decreases the visibility of the metal electrode layer.

Optionally, in the embodiment of the present disclosure, the plurality of first regions and the plurality of second regions in the mask plate may be arranged in various ways. Optionally, two adjacent first regions and second regions in the mask plate are arranged at intervals. Optionally, two adjacent first regions and second regions in the mask plate are arranged alternately. Alternatively, the mask plate may include two directly adjacent first regions and one second region. Alternatively, the mask plate may include two directly adjacent second regions and one first region.

Figure 8:
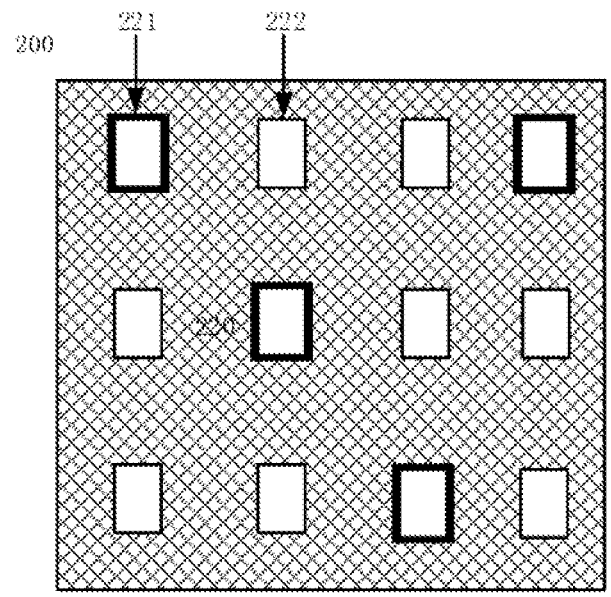
FIG. 8 is a schematic top view of another mask plate provided by an embodiment of the present disclosure.

For example, as shown in FIG. 4, in the plurality of first regions 221 and second regions 222 in the mask plate, the first regions 221 and the second regions 222 are arranged alternately. The structure of the first region in the mask plate shown in FIG. 4 is shown in FIG. 5. As shown in FIG. 8, in the plurality of first regions 221 and second regions 222 in the mask plate 200, two second regions 222 are directly adjacent to each other. The structure of the first region in the mask plate shown in FIG. 8 is shown in FIG. 6.

Optionally, in the embodiment of the present disclosure, the pattern of the first sub-region may be the same as that of the second region. Therefore, it can be ensured that during the process of forming via holes on the planarization layer using the mask plate, the source/drain layers exposed by the first via hole and the second via hole formed by exposure have the same area. As a result, it is possible to prevent inconsistent resistances of the switching devices for driving the sub-pixels resulting from inconsistent contact areas between the source/drain layers and the first metal layers of the sub-pixels in the manufactured display panel, which will affect the display effect of the display panel.

It can be understood that, in the embodiment of the present disclosure, when the structure of the first region in the mask plate is the structure shown in FIG. 5, the mask plate may be used in a halftone mask process. When the structure of the first region in the mask plate is the structure shown in FIG. 6, the mask plate may be used in a gray-tone mask process.

The mask plate provided by the embodiment of the present disclosure comprises: a transparent substrate; an opaque film layer, the opaque film layer being disposed on the transparent substrate. The opaque film layer includes a plurality of first regions and a plurality of second regions, a first sub-region in the first region and the second region are transmissive, and the remaining portion in the first region is semi-transmissive. The mask plate is used to form via holes in the planarization layer of the display panel by exposure, so that the angles between the first metal electrode layers disposed in the via holes and the source/drain layers of the display panel are small and diversified, decreasing the visibility of the metal electrode layers.

Figure 9:
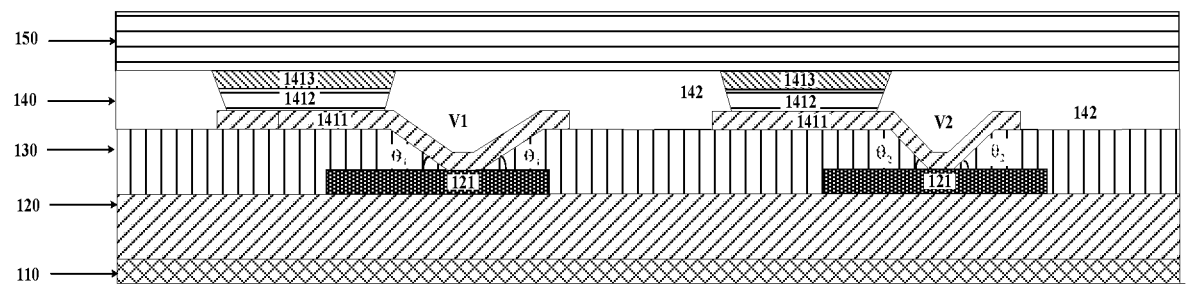
FIG. 9 is a schematic structural view of a display panel provided by an embodiment of the present disclosure.

An embodiment of the present disclosure provides a display panel. As shown in FIG. 9, the display panel comprises: a substrate 110, a driving function film layer 120, a planarization layer 130, and a display function film layer 140.

In the case that the display panel is a flexible display panel, the substrate 110 is a flexible substrate, and the flexible substrate may be made of an organic material.

The driving function film layer 120 is disposed on the substrate 110 to drive the display function film layer in the display panel for image display.

The planarization layer 130 is disposed on a side of the driving function film layer 120 away from the substrate. The planarization layer 130 is provided with a plurality of via holes V, and the plurality of via holes V expose the source/drain layers 121 arranged at intervals in the driving function film layer 120. During the manufacturing process of the display panel, the plurality of via holes V are formed by etching based on the mask plate described in the above embodiment through a mask process.

The display function film layer 140 is disposed on a side of the planarization layer 130 away from the substrate. A partial region of a first metal electrode layer 1411 in each sub-pixel in the display function film layer 140 is disposed in a corresponding via hole V, so that the first metal electrode layer 1411 of the sub-pixel is connected to the source/drain layer 121. The pixel definition layer 142 includes a plurality of via holes, and the plurality of via holes expose the first metal electrode layers 1411. An organic light emitting layer 1412 and a second metal electrode layer 1413 are disposed successively in the via holes in the pixel definition layer to form sub-pixels. The first metal electrode layer may be an anode layer, and the second metal electrode layer may be a cathode layer. Optionally, continuing to refer to FIG. 9, the display panel further comprises a thin film encapsulation layer 150 disposed on a side of the sub-pixel 141 away from the substrate 110 to isolate moisture and oxygen in the air and prevent damages to the display panel.

Optionally, continuing to refer to FIG. 9, the plurality of via holes in the planarization layer 130 of the display panel includes a first via hole V1 and a second via hole V2. The first via hole V1 may be formed by exposing the first region of the mask plate provided by the above embodiment, and the second via hole V2 may be formed by exposing the second region. The angle θ1 between the edge of the planarization layer forming the first via hole V1 and the source/drain layer is smaller than the angle θ2 between the edge of the planarization layer forming the second via hole V2 and the source/drain layer. It can be ensured that the angles between the first metal electrode layers formed in the via holes and the source/drain layers of the display panel become small and diversified, which decreases the visibility of the metal electrode layer.

In another optional embodiment, a plurality of first via holes V1 and second via holes V2 in the planarization layer 130 of the display panel may also be formed by etching through other mask processes. For example, a plurality of via holes are formed by etching in the planarization layer through a first mask process, and the angle between the edge of the planarization layer forming each via hole and the source/drain layer is the same. The edges of partial via holes in the plurality of via holes that form angles with the source/drain layers are then subjected to secondary exposure through a mask process again, so that the partial via holes are first via holes V1, and the remaining via holes in the planarization layer are second via holes V2. It can be understood that the exposure intensity during the first exposure is greater than the exposure intensity during the second exposure.

Optionally, the arrangement structure of the first via holes and the second via holes in the display panel provided by the embodiment of the present disclosure may be determined based on the structure of the mask plate through which the via holes are etched. Optionally, if the first regions and the second regions are arranged alternately in the mask plate, in the plurality of via holes formed in the planarization layer of the display panel, the first via holes and the second via holes are alternately arranged. If the mask plate includes two directly adjacent first regions and one second region, in the three adjacent via holes formed in the planarization layer of the display panel, the two directly adjacent via holes are first via holes, and the third via hole is a second via hole. If the mask plate includes two directly adjacent second regions and one first region, in the three adjacent via holes formed in the planarization layer of the display panel, the two directly adjacent via holes are second via holes, and the third via hole is a first via hole.

For example, if the mask plate shown in FIG. 4 is applied for manufacturing the display panel, in the plurality of via holes formed in the planarization layer of the display panel, the first via V1 and the second via V2 are adjacent to each other. If the mask plate shown in FIG. 8 is applied for manufacturing the display panel, in the plurality of via holes formed in the planarization layer of the display panel, two via holes of three adjacent via holes are second via holes V2, and the third via hole is a first via hole V1.

It can be understood that, in the display panel provided by the embodiment of the present disclosure, the display function film layer of the display panel includes a plurality of pixels. Each pixel is typically composed of an R sub-pixel, a G sub-pixel and a B sub-pixel. For this display panel, in a plurality of sub-pixels emitting the same color (such as a plurality of R sub-pixels), the angles between the portions of a plurality of first metal electrode layers in the via holes of the planarization layer and the source/drain layers may be equal or unequal. Alternatively, for each pixel, in the three sub-pixels emitting three colors, the angles between the portions of the three first metal electrode layers in the via holes of the planarization layer and the source/drain layers are equal or unequal.

It is to be noted that, in the display panel provided by the embodiment of the present disclosure, the driving function film layer may generally include one source/drain layer, or two source/drain layers. For a driving function film layer including one source/drain layer, the driving function film layer may include a silicon-based substrate, a first planarization layer, a gate layer, and a second planarization layer that are successively disposed on the substrate. The second planarization layer is provided a source/drain layer on a side away from the substrate. The first planarization layer and the second planarization layer are provided with via holes, and the source/drain layer is connected to the silicon-based substrate through the via holes.

Figure 10:
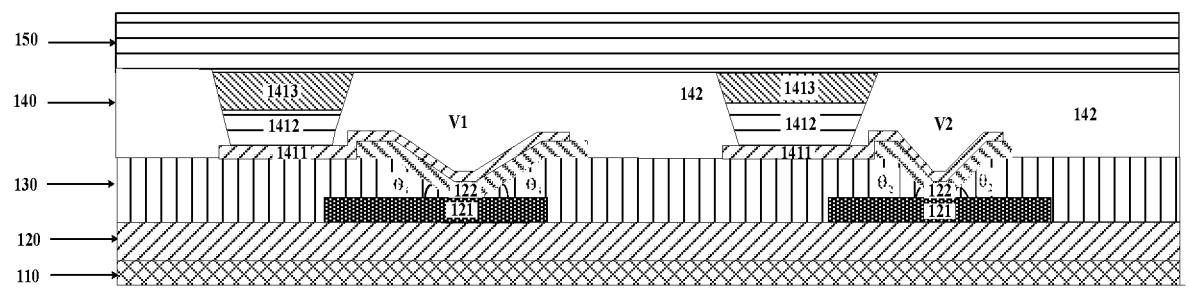
FIG. 10 is a schematic structural view of a display panel provided by an embodiment of the present disclosure.

For example, when the driving function film layer includes two source/drain layers, the structure of the display panel is as shown in FIG. 10. The first via hole V1 and the second via hole V2 of the planarization layer 130 are provided with a first source/drain layer 122, and a partial region of the first metal electrode layer 1411 in each sub-pixel in the display function film layer 140 is disposed in a corresponding via hole, so that the first metal electrode layer 1411 of the sub-pixel is connected to the first source/drain layer 122.

The display panel provided by the embodiment of the present disclosure comprises: a substrate; a driving function film layer, the driving function film layer being disposed on the substrate; a planarization layer, the planarization layer being disposed on a side of the driving function film layer away from the substrate and provided with a plurality of via holes, the plurality of via holes exposing the source/drain layers arranged at intervals in the driving function film layer and formed by etching based on the mask plate described in the above embodiment; a display function film layer, the display function film layer being disposed on a side of the planarization layer away from the substrate, and a partial region of the first metal electrode layer of each sub-pixel in the display function film layer being disposed in a corresponding via hole to connect the first metal electrode layer to the source/drain layer. The angles between the metal electrode layers and the source/drain layers of the display panel are small and diversified, which decreases the visibility of the metal electrode layer.

An embodiment of the present disclosure provides a display device comprising the display panel described above. Alternatively, in the display device, a plurality of via holes for exposing the source/drain layers are formed by etching based on the mask plate described in the foregoing embodiment. The display device may be any product or component having a display function such as a liquid crystal panel, an electronic paper, a mobile phone, a tablet computer, a TV, a display, a notebook computer, a digital photo frame, a navigator, etc. Optionally, the display device may be a flexible display device.

What have been described are only preferred embodiments of the present disclosure and explanations of the applied technical principles. Those skilled in the art should understand that the inventive scope involved in the present disclosure is not limited to technical solutions formed by specific combinations of the above technical features, and should also encompass other technical solutions formed by any combinations of the above technical features or their equivalent features without departing from the inventive concept, for example, technical solutions formed by replacing the above features and technical features having similar functions as those disclosed in the present disclosure (but not limited to) with each other.

What is claimed is:

1. A mask plate, comprising:
a transparent substrate; and
an opaque film layer, the opaque film layer being disposed on the transparent substrate,
wherein the opaque film layer comprises a plurality of first regions and a plurality of second regions,
wherein a first sub-region in a first region of the plurality of first regions and a second region of the plurality of second regions are transmissive, and
wherein a remaining portion in the first region is semi-transmissive, the remaining portion in the first region comprises an annular third sub-region surrounding the first sub-region from four sides and an annular fourth sub-region surrounding the third sub-region from four sides, the third sub-region is opaque, and the fourth sub-region is transmissive.

2. The mask plate according to claim 1,
wherein a distance between a third edge line and a fourth edge line in the first region is 0.5 $\mu$m-2 $\mu$m, the third edge line is a boundary line between the third sub-region and the first sub-region, and
wherein the fourth edge line is a boundary line between the third sub-region and the fourth sub-region.

3. The mask plate according to claim 1,
wherein a distance between a fourth edge line and a fifth edge line in the first region is 0.5 $\mu$m-2.5 $\mu$m,
wherein the fourth edge line is a boundary line between the third sub-region and the fourth sub-region, and
wherein the fifth edge line is a boundary line between the opaque film layer and the fourth sub-region.

4. The mask plate according to claim 1, wherein the first regions and the second regions are arranged at intervals.

5. A display panel, comprising:
a substrate;
a driving function film layer, the driving function film layer being disposed on the substrate;
a planarization layer, the planarization layer being disposed on a side of the driving function film layer away from the substrate, the planarization layer being provided with a plurality of via holes, the plurality of via holes exposing a plurality of source/drain layers arranged at intervals in the driving function film layer, the plurality of via holes being formed by etching, and sidewalls of at least some of the plurality of via holes being sloped with respect to the plurality of source/drain layers; and
a display function film layer, the display function film layer being disposed on a side of the planarization layer away from the substrate, a partial region of a first metal electrode layer of each sub-pixel in the display function film layer being disposed in a corresponding via hole to connect the first metal electrode layer to a respective source/drain layer of the plurality of source/drain layers that is exposed by the corresponding via hole,
wherein the plurality of via holes comprises a first via hole and a second via hole, and
wherein an angle between an edge of the planarization layer that forms the first via hole and the source/drain layer that is exposed by the first via hole is smaller than an angle between an edge of the planarization layer that forms the second via hole and the source/drain layer that is exposed by the second via hole.

6. The display panel according to claim 5, wherein the first via hole and the second via hole are adjacent to each other.

7. A display device comprising the display panel according to claim 5.

8. The display device according to claim 7, wherein the first via hole and the second via hole are adjacent to each other.

* * * * *